United States Patent [19]

Kawashima et al.

[11] Patent Number: 5,403,614
[45] Date of Patent: Apr. 4, 1995

[54] METHOD FOR MAKING AN ELECTROLUMINESCENT ELEMENT

[75] Inventors: Tomoyuki Kawashima, Yokohama; Harutaka Taniguchi; Hisato Kato, both of Yokosuka; Kazuyoshi Shibata, Yokohama, all of Japan

[73] Assignee: Fuji Electric Co., Ltd., Kawasaki, Japan

[21] Appl. No.: 45,904

[22] Filed: Apr. 12, 1993

[30] Foreign Application Priority Data

Apr. 14, 1992 [JP] Japan .................. 4-093192

[51] Int. Cl.⁶ ........................... B05D 5/06
[52] U.S. Cl. ..................... 427/66; 427/69; 427/255.5; 427/282; 427/419.1; 427/419.7; 204/192.1; 204/192.11; 204/92.22; 204/192.26
[58] Field of Search ........... 427/66, 69, 248.1, 282, 427/419.1, 419.7, 255.5; 204/192.1, 192.11, 192.22, 192.26

[56] References Cited

U.S. PATENT DOCUMENTS 4,511,599  4/1985  Rustomji ................. 427/66
4,746,548  5/1988  Boudreau et al. .......... 427/282
4,775,549 10/1988  Ota et al. ................ 427/66

Primary Examiner—Janyce Bell
Attorney, Agent, or Firm—Brumbaugh, Graves, Donohue & Raymond

[57] ABSTRACT

During manufacture of electroluminescent elements, layers of material are deposited upon a substrate as it is moving in a vacuum chamber beneath masks that shield the terminal regions of transparent electrodes formed upon the substrate. The masks are arranged so as to not contact the substrate, and are placed between the layer-forming material source. First insulation films, the light-emitting layers, or the second insulation films, or combinations thereof may be deposited using the method.

12 Claims, 4 Drawing Sheets

METHOD FOR MAKING AN ELECTROLUMINESCENT ELEMENT

BACKGROUND OF THE INVENTION

The present invention relates to a method for manufacturing a thin-film electroluminescent element used in indication devices.

A thin-film electroluminescent element provides electroluminescence (hereinafter abbreviated as EL) as a result of applying an electric field. Such elements are known to be useful as a display panel for thin indication devices because of the capability of the element for high brightness luminescence, high resolution, and variable displays on a large screen. The construction of the conventional thin-film EL element is shown in a cross section view in FIG. 2 and in a plan view in FIG. 3. Transparent indium-tin oxide ("ITO") electrodes 2 with a thickness of 2000 angstroms are formed in parallel strips on a glass substrate 1. A first insulation film 3 with a thickness of 3000 angstroms is laminated upon the substrate, using a material such as $Si_3N_4$ and a technique such as a sputtering process. A light-emitting layer 4 with a thickness of 5000 angstroms is then applied, using a material such as ZnS:Mn and a technique such as an electron beam deposition process. A second insulation film 5 is then laminated upon the light-emitting layer, again with a thickness of 3000 angstroms, using a material such as $Si_3N_4$ and a technique such as a sputtering process. An aluminum film is then applied with a thickness of 5000 angstroms using a sputtering process, and patterned to form rear electrodes 6 in parallel strips oriented perpendicular to the transparent electrodes 2.

Picture elements exist at the intersections of the transparent electrodes 2 and the rear electrodes 6. When an AC electrical field is applied across the transparent electrodes 2 and the rear electrodes 6, the picture elements emit light.

In order for such an EL element as described above to be used in practical applications, it is necessary to have electrode terminals 21 disposed on the ends of the transparent electrodes 2 and the rear electrodes 6 in order to make an electrical connection with the driving integrated circuits. Thus, it is important that the terminals 21 on the transparent electrodes 2 not be covered by the first insulation film 3, the light emitting layer 4, or the second insulation film 5. Further complicating the manufacture of the element is the fact that the light emitting layer 4 is generally made from materials such as ZnS, CdS, or SrS combined with a transition metal such as Mn or rare earth elements such as Tb, Sm, Ce and Eu. These light emitting materials dissolve easily in acidic or alkaline aqueous solutions, for example the mixture of phosphoric acid and nitric acid frequently is used to pattern the rear electrodes 6. If the light-emitting layer 4 dissolves as a result of making contact with an aluminum etching solution, film peel-off occurs on the second insulation film 5 and on the rear electrodes 6. Thus, both the manufacturing yield of the EL elements and the reliability of the elements decrease. For this reason the light-emitting layer 4 must be covered with the second insulation film 5 as shown in FIG. 2.

In a known method for obtaining EL elements, in order to obtain the patterns for each layer as described above, the ITO films disposed on the glass substrate 1 are patterned in parallel stripes to form transparent electrodes 2, whereupon the transparent electrode terminals 21 are covered with metallic masks to shield the terminals 21 while the first insulation film 3 is formed by a sputtering process. The metallic masks are then replaced with metallic masks that create an opening of smaller size than the opening created by the initial masks, whereupon the light emitting layer 4 is deposited by electron beam deposition. Next, the metallic masks are again replaced with masks that create an opening as large as the opening created by the initial masks used in forming the first insulation film 3, whereupon the second insulation film 5 is disposed using the sputtering process. The metallic masks are then removed, whereupon a layer of aluminum is disposed using a sputtering process, and is then patterned using an etching process to form the rear electrodes 6.

This method for manufacturing such conventional EL elements requires that the masks be replaced upon the formation of the first insulation film 3, the light emitting layer 4, and the second insulation film 5. Additionally, the substrate must be removed from a vacuum tank used by the sputtering equipment or the deposition equipment after the formation of each layer. Consequently, conventional manufacturing methods suffer from low productivity. Additionally, the high frequency of mask replacement creates the risk of contamination of the substrate surface, causing a reduction in the yield. All of these problems lead to an increased cost of manufacture.

It is an object of the present invention to solve these problems and to provide a method for manufacturing an EL element with high productivity and high yield while keeping the transparent electrode terminal exposed and the light emitting layer covered with the second insulation film.

SUMMARY OF THE INVENTION

In accordance with the claimed invention, an electroluminescent element is fabricated with high productivity and high yield by a process comprising the steps of:

(a) placing a mask close to but not in contact with a laminate comprising an insulating substrate and a plurality of transparent electrodes disposed on one side of the substrate in a parallel array, said mask being disposed on the same side of the laminate as the transparent electrodes so as to block portions of each transparent electrode at each end of the transparent electrode while leaving a central portion of each transparent electrode exposed through an opening in the mask;

(b) placing the masked laminate in a chamber having a source of film-forming material such that the mask is between the laminate and the source of film-forming material; and (c) depositing a layer of the film-forming material through the opening in the mask while moving the laminate with respect to the mask in a direction perpendicular to the array of transparent electrodes, wherein the layer deposited is an insulation layer or a light emitting layer.

The layer or layers deposited in this manner may be any of the first insulation film, the light-emitting layer, or the second insulation film. In a preferred embodiment all three layers are deposited in this manner.

Using the process of the invention, it is possible to form a complete device in a single chamber by transporting the substrate under successive masks and film-forming sources. Thus, masks of alternating opening sizes (i.e., large, small, large) may be used to form a device of the type shown in FIGS. 2 and 3. Alternatively, the first insulation film and the light emitting layer may be formed using a common mask, or masks having the same opening size disposed over the substrate surface that shields the transparent electrode terminals. The second insulation layer is then formed with a mask having a larger opening to allow the second insulation film to shield the light emitting layer.

It is also effective that the conductor film for the rear electrodes is formed by transporting the substrate in the same vacuum chamber after the second insulation film has been formed.

BRIEF DESCRIPTION OF THE DRAWINGS

FIG. 1 shows a thin-film EL element manufactured in accordance with a first embodiment of the invention;

FIG. 1b shows the A—A line cross section of FIG. 1a;

FIG. 1c shows the B—B line cross section of FIG. 1a;

FIG. 6 shows a thin-film EL element manufactured in accordance with a second embodiment of the invention;

FIG. 6b shows the C—C line cross section of FIG. 6a;

FIG. 6c shows the D—D line cross section of FIG. 6a;

DESCRIPTION OF THE PREFERRED EMBODIMENT

Figure 1A:
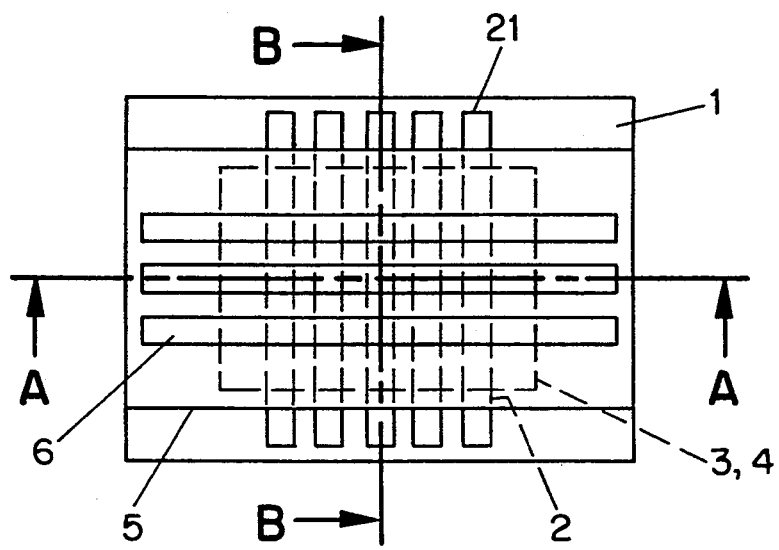
FIG. 1a shows a plan view of a thin-film EL element manufactured in accordance with the first embodiment of the invention.
Figure 1B:
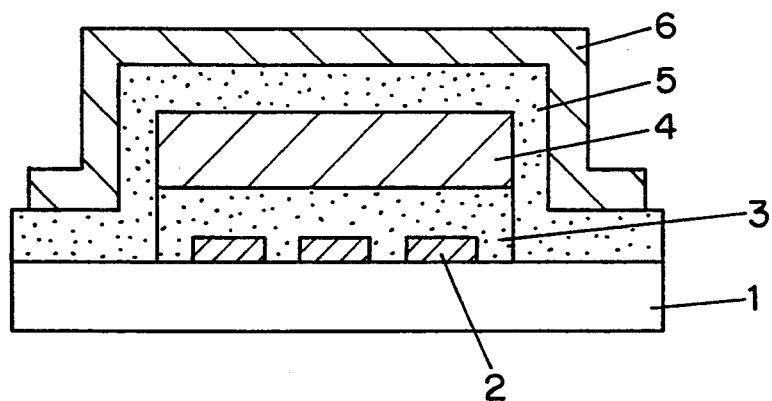
Figure 1C:
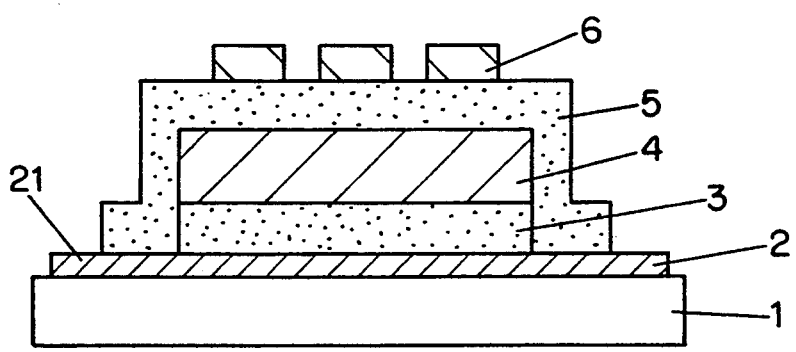
Figure 2:
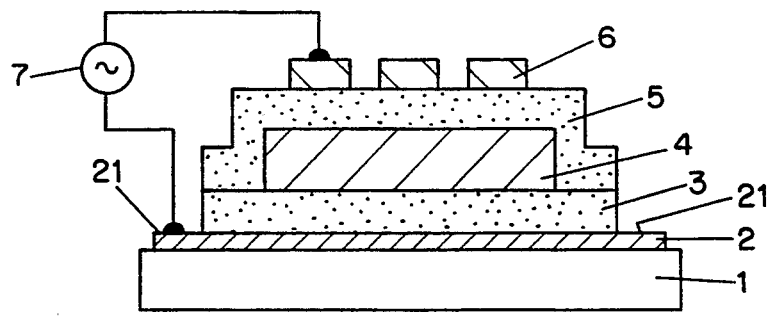
FIG. 2 shows a cross section of a conventional thin-film EL element.
Figure 3:
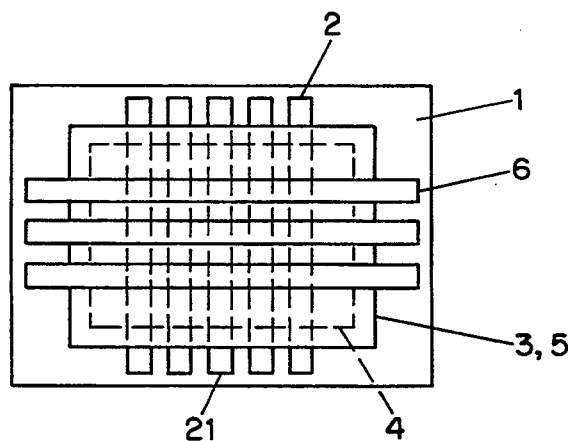
FIG. 3 shows a plan view of the conventional EL element of FIG. 2.

FIG. 1 shows a thin-film EL element manufactured using the first embodiment of the invention. The parts common to FIGS. 2 and 3 are given the same numerals. This element can be manufactured by applying the following processes.

Firstly, after covering the glass substrate 1 with an ITO film having a thickness of 2000 angstroms, patterning is done in parallel strips to form the transparent electrodes 2. A metallic mask is then placed on the substrate to cover its periphery, whereupon the first insulation film 3 with a thickness of 3000 angstroms made from Si3N4 is deposited using a sputtering process. The light emitting layer 4 with a thickness of 6000 angstroms made from ZnS:Mn is formed in the same vacuum tank, while the metallic mask remains fixed. This means that the first insulation film 3 and the light-emitting layer 4 are laminated on an area of the same size.

Figure 4:
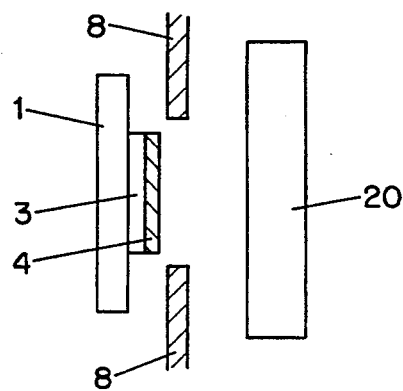
FIG. 4 shows a cross section of an EL element according to the first embodiment of the present invention, at the stage when the second insulation film is sputtered.
Figure 5:
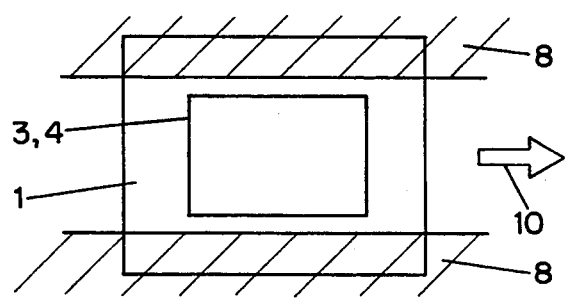
FIG. 5 shows a perspective plan view of the substrate as seen from the mask side at the stage shown in FIG. 4.

The substrate 1 formed with the transparent electrodes 2, the first insulation film 3, and the light emitting layer 4 are taken out from the vacuum tank in the manner described above, and the metallic mask is removed. The substrate 1 is then put against the $Si_3N_4$ target 20 in another vacuum tank as shown in FIG. 4, between which the masks 8 are arranged so as to shield the edges of the transparent electrodes 2. FIG. 5 is a perspective view of this stage looking through the mask 8 to the substrate 1, and shows that the opening in mask 8 is larger in size than the light emitting layer 4.

The substrate 1 is then transported in the vacuum tank in the direction indicated by the arrow 10 while the substrate is sputtered, forming the second insulation film 5 made of $Si_3N_4$ in a belt-shape with a thickness of 3000 angstroms, with the electrode terminals 21 on the transparent electrodes 2 protected by the mask 8. Although the mask 8 does not come in contact with the glass substrate 1, it is desirable that the mask be disposed as close to the substrate as possible, preferably with an interval from 0.5 mm to 3 mm. By placing the mask 8 in this position, the surface of the light emitting layer 4 becomes entirely covered with the second insulation film.

Subsequently, an aluminum film with a thickness of 5000 angstroms is formed using a sputtering process over the entire area of the substrate 1, which has been transported in the vacuum tank to a place where no mask 8 exists. The aluminum film is then patterned via wet etching using an aqueous mixture of phosphoric acid and nitric acid to form the rear electrodes 6.

In this manufacturing process the surface and the sides of the light-emitting layer 4 are covered with the second insulating film 5 when the aluminum film is etched to form the rear electrodes 6. Therefore none of the light emitting layer is exposed to the etching solution, which results in no reduction in the yield or reliability due to film peel-off. In addition, because the formation for the first insulation film 3, the light-emitting layer 4, the second insulation film 5, and the metallic layer for the rear electrodes 6 are carried out continuously in the same vacuum tank, productivity is increased and contamination can be avoided during the process.

Figure 6A:
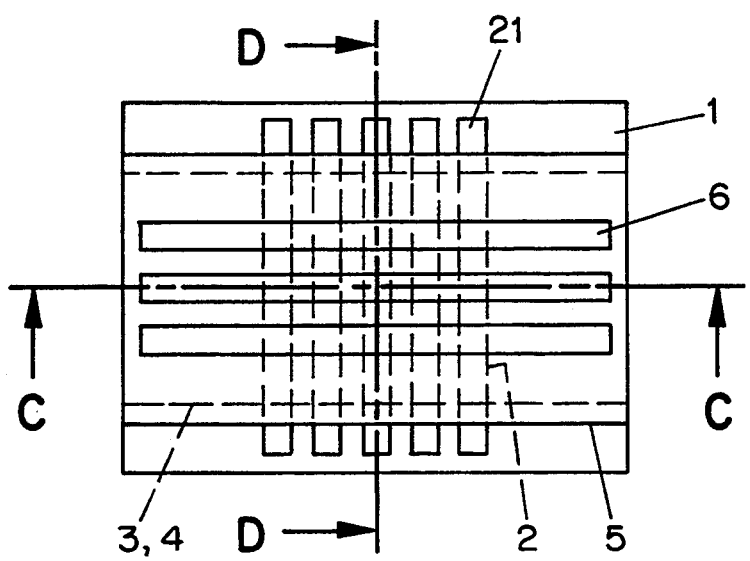
FIG. 6a shows a plan view of a thin-film EL element manufactured in accordance with the second embodiment of the invention.
Figure 6B:
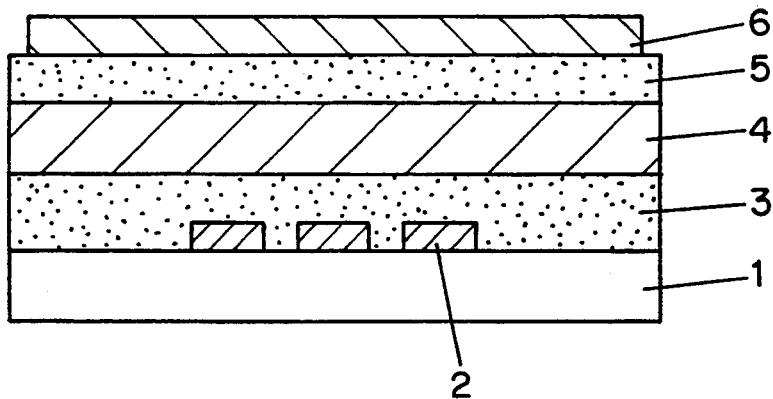
Figure 6C:
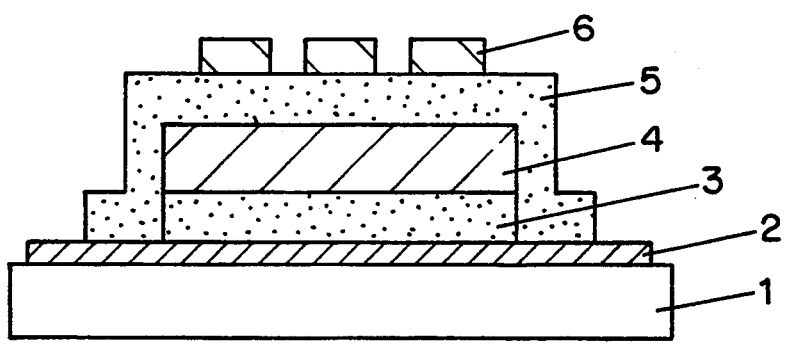

FIG. 6 shows a thin-film EL element manufactured using a second embodiment of the present invention, in which the parts common to those in FIGS. 1, 2, and 3 are given the same numerals.

Figure 7:
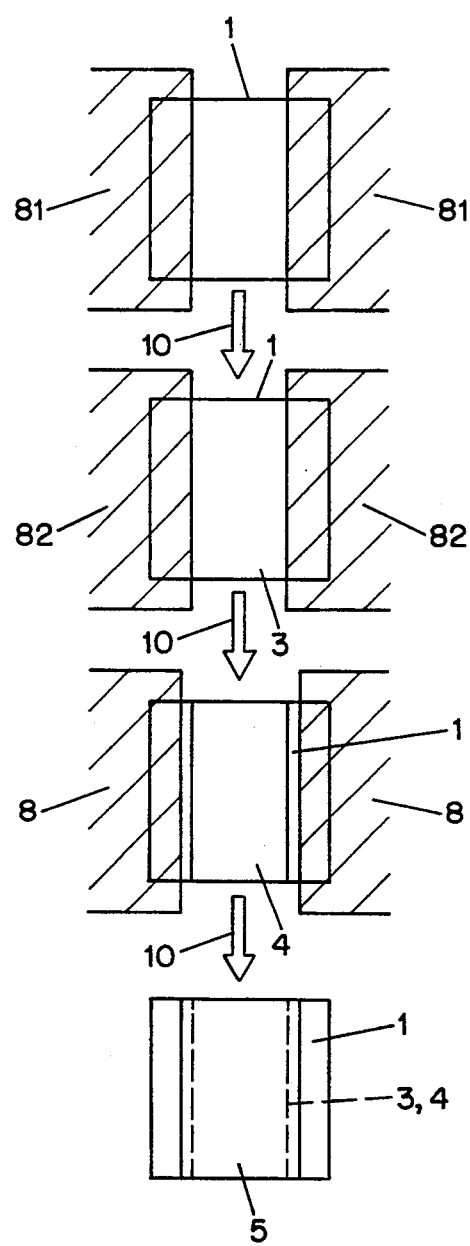
FIG. 7 shows a plan view of part of the manufacturing process for the second embodiment of the invention.

FIG. 7 shows an alternative method for manufacturing an EL element. In accordance with this embodiment, the transparent electrodes 2 are formed in strips upon the substrate 1 to form a laminate. This laminate is then transported in a single vacuum chamber in the direction as indicated by the arrow 10, past masks 81, 82, and 8 which shield the terminal ends of the electrodes 2, and which are kept close to but not touching (i.e., with a source for the first insulating film, e.g., 0.5 mm to mm away from) the laminate. Mask 81 is disposed in alignment between a $Si_3N_4$ target (not shown) and the substrate 1. Mask 82, shown as shielding the same area as mask 81, is disposed in alignment with a second source of film forming material suitable for producing the light emitting layer 4, e.g. a ZnS:Mn target. Masks 8 having a larger opening than mask 82 is arranged in a similar manner in alignment with a source for the second insulation layer 5, e.g. a $Si_3N_4$ target. As the laminate is moved along under the masks, the insulation layers 3 and 5 and the light emitting layers 4 are formed through the openings in mask 81, 8, and 82. By sputtering the second insulation film 5 is formed so as to cover the surface and the sides parallel of the light emitting layer 4. Next, a sputtering process is carried out to form an aluminum film but without using the masks such that the aluminum film covers the entire area. The rear electrodes 6 are patterned upon this aluminum film via wet etching after the substrate 1 is taken out of the vacuum tank.

Figure 8:
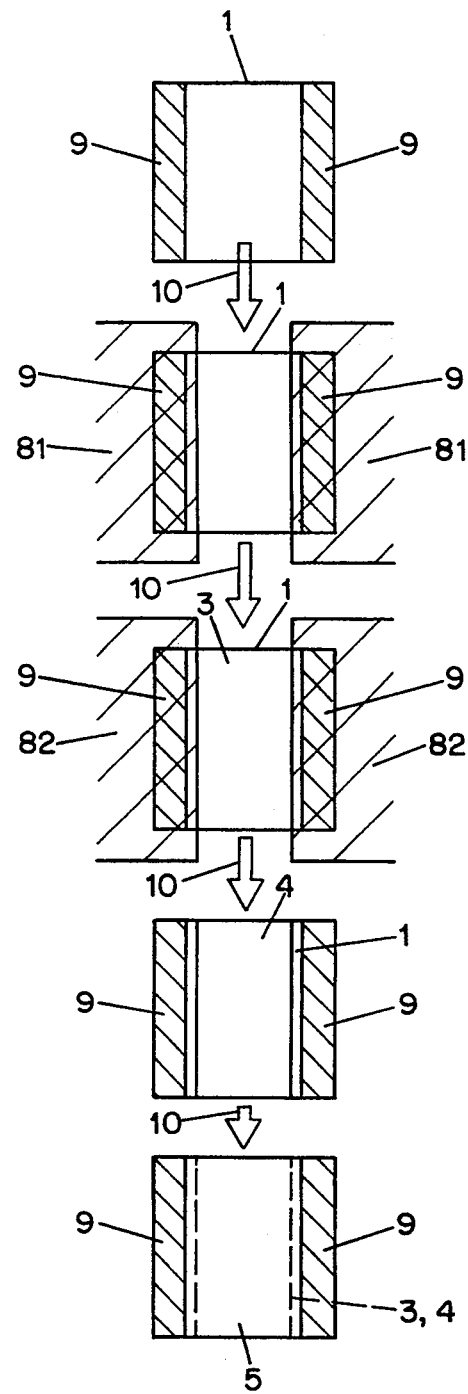
FIG. 8 shows a plan view of part of the manufacturing process for a third embodiment of the invention.

FIG. 8 shows a third embodiment of the method of the present invention. In this embodiment metallic masks 9 are attached to the substrate 1 so that the previously formed terminals 21 on the transparent electrodes 2 are covered. The resulting laminate is then transported in the direction of the arrow 10 beneath masks 81 and 82 having openings which expose a central portion of the laminate but not the metal shields 9, and the first insulation layer 3 and the light-emitting layer 4 are formed through the masks, e.g. using $Si_3N_4$ and ZnS:Mn. The laminate is then transported in the direction of the arrow 10 in the same vacuum tank so that it faces the $Si_3N_4$ target to form the second insulation film 5 using a sputtering process without a separate mask on the part not covered by the metallic masks 9. Finally, after aluminum film is sputtered in the same vacuum tank and patterned to form the rear electrodes 6, the metal masks 9 are removed, the process of which is not shown. Thus the thin-film EL element with the same construction as the one shown in FIG. 6 is obtained.

While the sputtering process was used to form each layer in the above embodiments, the layers may be formed in the same manner by using masks in a similar proximity to the substrate face, even when a vacuum deposition or an MOCVD process is used. The same process can be applied to a multi-color emitting thin-film EL element. The various light emitting layers emit different colors and are arranged two-dimensionally on the substrate. After other layers are formed and patterned, where the light-emitting layer is not of a single layer, in addition to the yellow color-emitting layer made of ZnS:Mn, the layer formation and patterning of a green color-emitting layer made of ZnS:Tb and a red color-emitting layer made of ZnS:Sm is performed.

We claim:

1. A method for making an electroluminescent element, comprising the steps of:
    (a) placing a mask close to but not in contact with a laminate comprising an insulating substrate and a plurality of transparent electrodes disposed on one side of the substrate in a parallel array, said mask being disposed on the same side of the laminate as the transparent electrodes so as to block portions of each transparent electrode at each one of the transparent electrode while leaving a central portion of each transparent electrode exposed through an opening in the mask;
    (b) placing the masked laminate in a chamber having a source of vapor-phrase film-forming material such that the mask is between the laminate and the source of film-forming material; and
    (c) forming a layer of the film-forming material by deposition comprising transfer of at least one film-forming substance through the opening in the mask while moving the laminate with respect to the mask in a direction perpendicular to the array of transparent electrodes, wherein the layer deposited is an insulation layer or a light emitting layer.

2. A method according to claim 1, wherein the layer of the film-forming material is an insulation film.

3. A method according to claim 1, wherein the layer of the film-forming material is a light emitting layer.

4. A method according to claim 3, wherein a layer of insulation film is formed upon the light emitting layer by repositioning the mask used in forming the light emitting layer to expose an area greater than that exposed in the formation of the light emitting layer, so that the layer of insulation film shields said light emitting layer.

5. A method according to claim 1, wherein a first layer of insulation film, a layer of light emitting material, and a second layer of insulation film are deposited.

6. A method according to claim 5, wherein the second layer of insulation film is formed by repositioning the mask used in forming the light emitting layer to expose an area greater than that exposed in the formation of the light emitting layer, so that the second layer of insulation film shields said light emitting layer.

7. A method according to claim 5, wherein the first layer of insulation film, the layer of light emitting material, and the second layer of insulation film are deposited in vacuum chamber and the same vacuum chamber is used for depositing the first layer of insulation film, the layer of light emitting material, and the second layer of insulation film.

8. A method according to claim 1, wherein a first insulation layer and a light emitting layer are formed with the same area by using a common mask disposed over the laminate.

9. A method according to claim 8, wherein forming a layer of an insulation film disposed upon the light emitting layer comprises repositioning portions of the mask used in forming the light emitting layer to expose an area greater than that exposed in the formation of the light emitting layer, so that the layer of insulation film shields said light emitting layer.

10. A method according to claim 1, wherein, in step (c), transfer of the substance through the opening is in the course of sputtering.

11. A method according to claim 1, wherein, in step (c), transfer of the substance through the opening is in the course of vacuum deposition.

12. A method according to claim 1, wherein, in step (c), transfer of the substance through the opening is in the course of metal-organic chemical vapor deposition.

* * * * *